(12) United States Patent
Campbell et al.

(10) Patent No.: US 6,973,801 B1
(45) Date of Patent: Dec. 13, 2005

(54) COOLING SYSTEM AND METHOD EMPLOYING A CLOSED LOOP COOLANT PATH AND MICRO-SCALED COOLING STRUCTURE WITHIN AN ELECTRONICS SUBSYSTEM OF AN ELECTRONICS RACK

(75) Inventors: Levi A. Campbell, New Paltz, NY (US); Richard C. Chu, Hopewell Junction, NY (US); Michael J. Ellsworth, Jr., Lagrangeville, NY (US); Madhusudan K. Iyengar, Rhinebeck, NY (US); Roger R. Schmidt, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 32 days.

(21) Appl. No.: 11/008,711

(22) Filed: Dec. 9, 2004

(51) Int. Cl.⁷ ............................................ F25D 23/12
(52) U.S. Cl. ............... 62/259.2; 165/80.3; 165/104.32; 361/698
(58) Field of Search ...................... 62/259.2; 165/80.3, 165/80.4, 104.32, 104.33; 361/698, 699, 361/701

(56) References Cited

U.S. PATENT DOCUMENTS

| | | | |
|---|---|---|---|
| 5,131,233 A | 7/1992 | Cray et al. ..................... | 62/64 |
| 5,924,482 A | 7/1999 | Edwards et al. ........ | 165/104.33 |
| 6,019,165 A | 2/2000 | Batchelder ................. | 165/80.3 |
| 6,408,937 B1 | 6/2002 | Roy ....................... | 165/104.33 |
| 6,498,725 B2 | 12/2002 | Cole et al. .................. | 361/700 |
| 6,587,345 B2 | 7/2003 | Chu et al. ................... | 361/719 |
| 6,604,370 B2 | 8/2003 | Bash et al. .................... | 62/171 |
| 6,604,571 B1 | 8/2003 | Morrow et al. ........ | 165/104.21 |
| 6,625,023 B1 | 9/2003 | Morrow et al. ............. | 361/700 |
| 6,628,520 B2 * | 9/2003 | Patel et al. .................. | 361/696 |
| 2003/0072656 A1 | 4/2003 | Niwatsukino et al. ...... | 417/354 |
| 2004/0012914 A1 | 1/2004 | Chu et al. .................... | 361/679 |
| 2004/0123614 A1 | 7/2004 | Stewart ..................... | 62/259.2 |

OTHER PUBLICATIONS

"MEMS-Based Heat Exchanger Cools "Hot" CPUs," www.graniteve.com, Granite Ventures, LLC, Sep. 29, 2003 (3 pgs.).
Catalog, "Microstructure Liquid Cooler: Outstanding Cooling Performance for Electronic Devices," Atotech (2003) (6 pgs.).
Valenzuela, J.A., et al., "Cooling High Heat Flux Devices with Mikros Microchannel Heat Sinks," μikros Manufacturing, Inc., Aug. 2003 (13 pgs.).

(Continued)

Primary Examiner—Melvin Jones
(74) Attorney, Agent, or Firm—Lily Neff, Esq.; Kevin P. Radigan, Esq.; Heslin Rothenberg Farley & Mesiti, P.C.

(57) ABSTRACT

A cooling approach is provided for one or more subsystems of an electronics rack. The cooling approach employs a coolant distribution unit and a thermal dissipation unit. The coolant distribution unit has a first heat exchanger, a first cooling loop and a second cooling loop. The first cooling loop passes facility coolant through the first heat exchanger, and the second cooling loop provides system coolant to an electronics subsystem, and expels heat in the first heat exchanger from the subsystem to the facility coolant. The thermal dissipation unit is associated with the electronics subsystem and includes a second heat exchanger, the second cooling loop, and a third cooling loop. The second cooling loop provides system coolant to the second heat exchanger, and the third cooling loop circulates conditioned coolant within the electronics subsystem and expels heat in the second heat exchanger from the electronics subsystem to the system coolant.

26 Claims, 6 Drawing Sheets

OTHER PUBLICATIONS

Chu et al., "Thermal Dissipation Assembly and Fabrication Method for Electronics Drawer of a Multiple-Drawer Electronics Rack," U.S. Appl. No.: 10/675,628, filed Sep. 30, 2003.

Chu et al., "Cooling System and Method Employing At Least Two Modular Cooling Units for Ensuring Cooling of Multiple Electronics Subsystems," U.S. Appl. No.: 10/726,377, filed Dec. 13, 2003.

Chu et al., "Method, System and Program Product for Automatically Checking Coolant Loops of a Cooling System for a Computing Environment," U.S. Appl. No.: 10/736,944, filed Dec. 16, 2003.

Chu et al., "Method, System and Program Product for Monitoring Rate of Volume Change of Coolant Within a Cooling System," U.S. Appl. No.: 10/736,947, filed Dec. 16, 2003.

Campbell et al., "Cooling System and Method Employing Auxiliary Thermal Capacitor Unit for Facilitating Continuous Operation of an Electronics Rack," U.S. Appl. No.: 10/930,079, filed Aug. 31, 2004.

* cited by examiner

US 6,973,801 B1

COOLING SYSTEM AND METHOD EMPLOYING A CLOSED LOOP COOLANT PATH AND MICRO-SCALED COOLING STRUCTURE WITHIN AN ELECTRONICS SUBSYSTEM OF AN ELECTRONICS RACK

CROSS-REFERENCE TO RELATED APPLICATIONS

This application contains subject matter which is related to the subject matter of the following applications, each of which is assigned to the same assignee as this application and each of which is hereby incorporated herein by reference in its entirety:

"Cooling Apparatus And Method For An Electronics Module Employing An Integrated Heat Exchange Assembly," Campbell et al., Ser. No. 11/008,359, co-filed herewith;

"Cooling Apparatus For An Electronics Subsystem Employing A Coolant Flow Drive Apparatus Between Coolant Flow Paths," Campbell et al., Ser. No. 11/008,732, co-filed herewith; and "Electronic Device Substrate Assembly With Multi-Layer Impermeable Barrier and Method of Making," Chu et al., Ser. No. 10/197,661, filed Jul. 17, 2002, and published as U.S. Publication No. U.S. 2004/0812914 A1, on Jan. 22, 2004.

TECHNICAL FIELD

The present invention is directed to cooling assemblies and other apparatus used for removing heat from electronics devices, modules and systems. More particularly, this invention relates to an enhanced cooling system and method for extracting heat from heat generating components of one or more electronics subsystems of one or more electronics racks.

BACKGROUND OF THE INVENTION

As is well known, as the circuit density of electronic chip devices increases in order to achieve faster and faster processing speed, there is a correspondingly increasing demand for the removal of heat generated by these devices. The increased heat demand arises both because the circuit devices are packed more closely together and because the circuits themselves are operated at increasingly higher clock frequencies. Nonetheless, it is also known that runaway thermal conditions and excessive heat generated by chips is a leading cause of failure of chip devices. Furthermore, it is anticipated that demand for heat removal from these devices will increase indefinitely. Accordingly, it is seen that there is a large and significant need to provide useful cooling mechanisms for electronic circuit devices.

Each new generation of computers continues to offer increased speed and function. In most cases, this has been accomplished by a combination of increased power dissipation and increased packaging density. The net result has been increased heat flux at all levels of packaging. For example, a common packaging configuration for many large computer systems today is a multi-drawer rack, with each drawer containing one or more processor modules along with associated electronics, such as memory, power and hard drive devices. These drawers are removable units so that in the event of failure of an individual drawer, the drawer may be removed and replaced in the field. The problem with this configuration is that the increase in heat flux at the electronics drawer level makes it increasingly difficult to dissipate heat by simple air cooling.

SUMMARY OF THE INVENTION

The shortcomings of the prior art are overcome and additional advantages are provided through a cooling system which includes: a coolant distribution unit, the coolant distribution unit comprising a first heat exchanger, a first cooling loop and at least one second cooling loop, the first cooling loop receiving facility coolant and passing at least a portion thereof through the first heat exchanger, the at least one second cooling loop providing system coolant to at least one electronics subsystem, and expelling heat in the first heat exchanger from the at least one electronics subsystem to the facility coolant in the first cooling loop; and at least one thermal dissipation unit associated with the at least one electronics subsystem, each thermal dissipation unit comprising a second heat exchanger, a second cooling loop of the at least one second cooling loop, and a third cooling loop, the second cooling loop providing system coolant to the second heat exchanger, the third cooling loop circulating conditioned coolant within the at least one electronics subsystem and expelling heat in the second heat exchanger from the at least one electronics subsystem to the system coolant in the second cooling loop.

In another aspect, a cooled electronics system is provided. The cooled electronics system includes at least one electronics rack comprising a plurality of electronics subsystems, and a cooling system. The cooling system includes a coolant distribution unit and multiple thermal dissipation units. The coolant distribution unit includes a first heat exchanger, a first cooling loop and a plurality of second cooling loops. The first cooling loop receives facility coolant and passes at least a portion thereof through the first heat exchanger. The plurality of second cooling loops provide system coolant to at least some of the plurality of electronics subsystems, and expels heat in the first heat exchanger from the at least some electronics subsystems to the facility coolant in the first cooling loop. Each thermal dissipation unit is associated with a respective one of the at least some electronics subsystems, and each unit includes a second heat exchanger, a second cooling loop of the plurality of second cooling loops, and a third cooling loop. The second cooling loop provides system coolant to the second heat exchanger, and the third cooling loop circulates conditioned coolant within the respective electronics subsystem and expels heat in the second heat exchanger from the electronics subsystem to system coolant in the second cooling loop.

Methods of fabricating a cooling system for an electronics subsystem and methods of cooling an electronics rack comprising a plurality of electronics subsystems are also described and claimed.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

As used herein, "electronics subsystem" comprises any housing, compartment, drawer, blade, etc., containing one or more heat generating components of a computer system or other electronics system requiring cooling. The term "electronics rack" includes any frame, rack, blade server system, etc., having a heat generating component of a computer system or electronics system, and may be, for example, a stand alone computer processor having high, mid or low end processing capability. In one embodiment, an electronics rack may comprise multiple electronics subsystems, each having one or more heat generating components requiring cooling. Each heat generating component may comprise an electronics device, an electronics module, an integrated circuit chip, etc. As used herein, "micro-scaled cooling structure" means a cooling structure with a characteristic dimension of 200 microns or less.

One example of coolant within a cooling system in accordance with an aspect of the present invention is water. However, the concepts disclosed herein are readily adapted to use with other types of coolant on the facility side, system side, and conditioned coolant side of the cooling system. For example, one or more of the coolants may comprise a brine, a fluorocarbon liquid, a liquid metal, or other similar coolant, or a refrigerant, while still maintaining the advantages and unique features of the present invention.

As noted briefly above, power levels in computer equipment (primarily processors) are again rising to a level where they no longer can be simply air cooled. The components will likely be water cooled. Heat dissipated by the processor can be transferred to water via a water cooled cold plate. Facility water typically available at customer locations (i.e., data centers) is not suitable for use in these cold plates. First, condensation formation is a concern as the temperature of the data center water, ranging from 7° C. to 15° C., is far below the room dew point (typically 18–23° C.). Second, the relatively poor quality of the facility water (in chemistry, cleanliness, etc.) impacts system reliability. It is therefore desirable to utilize a water cooling/conditioning unit that circulates higher quality water to/from the electronics subsystems and rejects the heat to the data center water. As used herein, "facility water" or "facility coolant" refers to, in one example, this data center water or coolant, while "system coolant" refers to cooled/conditioned coolant circulating between a coolant distribution unit and the electronics subsystems to be cooled, and "conditioned coolant" refers to coolant circulating within a given electronics subsystem.

Figure 1:
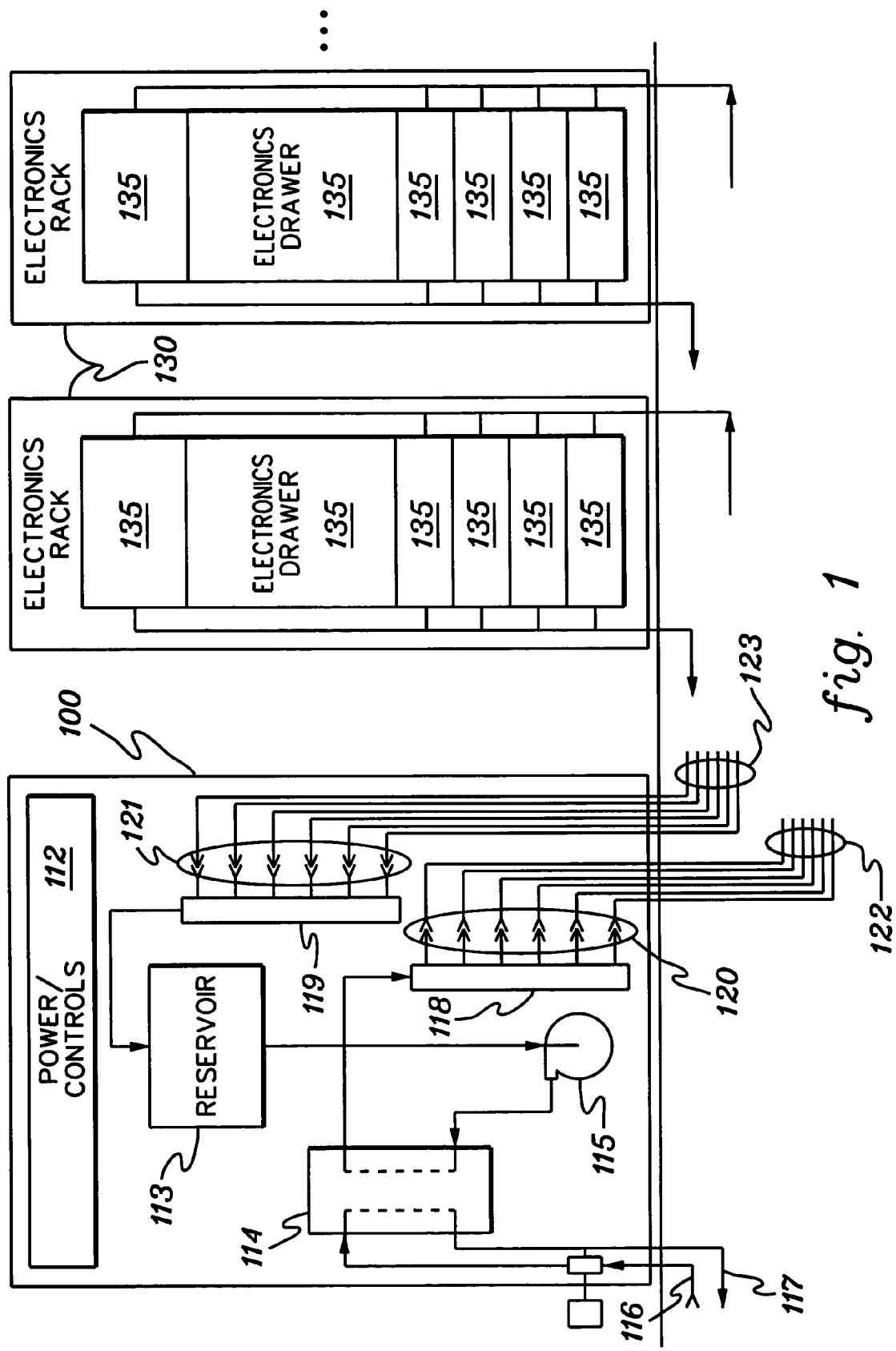
FIG. 1 depicts a conventional coolant distribution unit, such as a computer room water conditioning unit (CRWCU), for cooling one or more electronics racks of a computing environment.

Reference is now made to the drawings, wherein the same reference numbers used throughout different figures designate the same or similar components. FIG. 1 depicts one embodiment of a coolant distribution unit 100 for a computer room. The coolant distribution unit is conventionally a relatively large unit which occupies more than what would now be considered as two full electronics frames. Within the cooling unit 100 is a power/control element 112, a reservoir/expansion tank 113, a heat exchanger 114, a pump 115 (often accompanied by a redundant second pump), facility water (or site or customer service water or coolant) inlet 116 and outlet 117 supply pipes, a supply manifold 118 directing water to the electronics frames 130 via couplings 120 and lines 122, and a return manifold 119 directing water from the electronics frames 130, via lines 123 and couplings 121. Each electronics rack includes multiple electronics drawers or multiple electronics subsystems 135.

Figure 2:
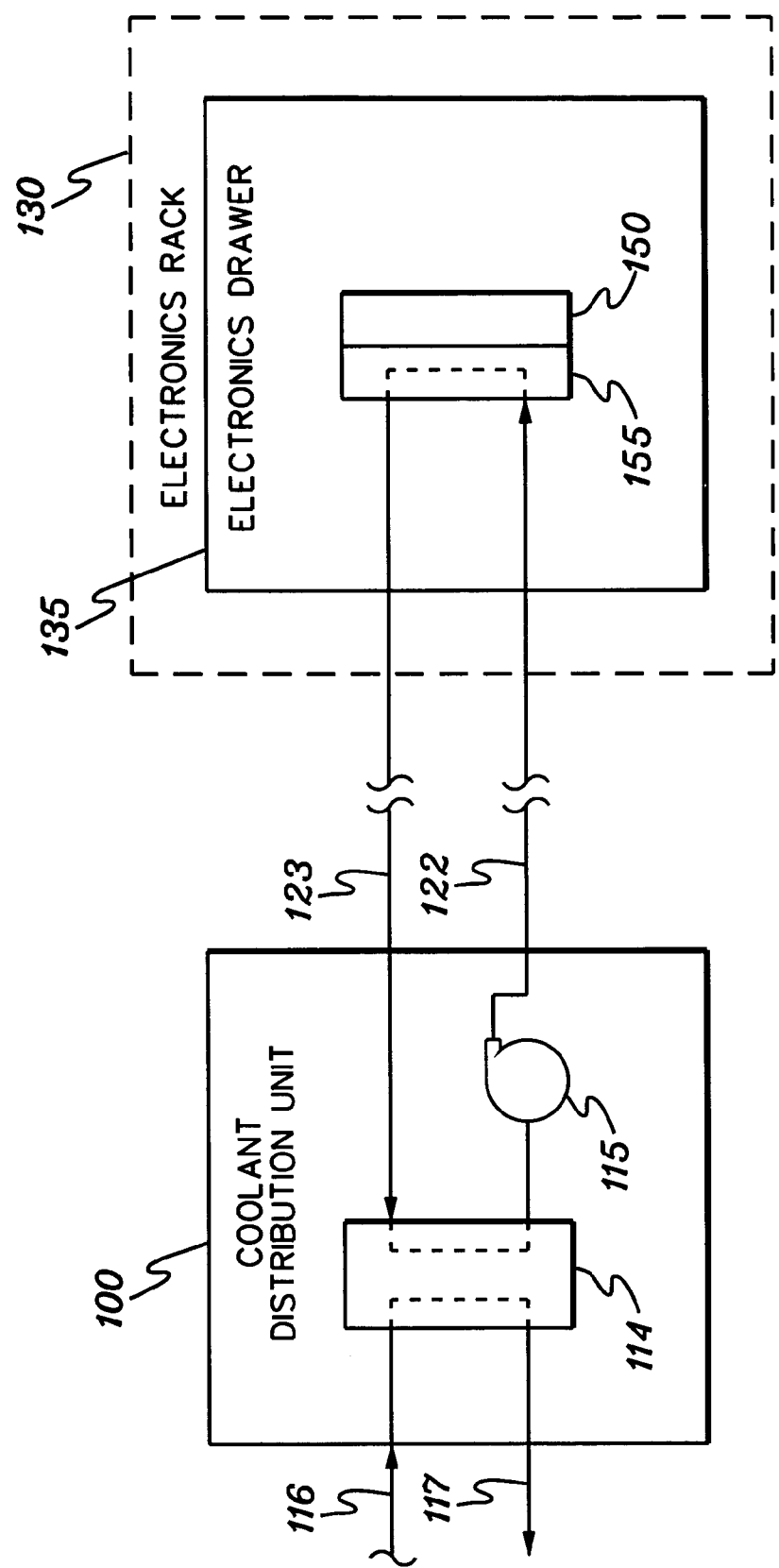
FIG. 2 is a schematic of one embodiment of an electronics drawer of an electronics rack and a cooling system therefor employing a conventional coolant distribution unit with a facility coolant loop and a system coolant loop.

FIG. 2 schematically illustrates operation of the cooling system of FIG. 1, wherein a liquid cooled cold plate 155 is shown coupled to an electronics module 150 of electronics drawer 135 within electronics rack 130. Heat is removed from electronics module 150 via the system coolant pumped via pump 115 through cold plate 155 within the system coolant loop defined by heat exchanger 114 of coolant distribution unit 100, lines 122, 123 and cold plate 155. The system coolant loop and coolant distribution unit are designed to provide coolant of a controlled temperature and pressure, as well as controlled chemistry and cleanliness to the electronics. Furthermore, the system coolant is physically separate from the less controlled facility coolant in lines 116, 117 to which heat is ultimately transferred to. Filtration has not been required in a system such as depicted in FIG. 2 since the system coolant loop has characteristic dimensions for fluid flow that are sufficiently large to allow residual particulate debris to flow freely through the loop. For example, a cold plate with 1.65 mm diameter channels was employed in the ES/9000 system offered by International Business Machines Corporation of Armonk, N.Y.

As noted, processor power levels continue to rise as designers push for ever increasing computing performance. Electronic module power levels are expected to go well beyond conventional air cooling technologies, and even beyond conventional liquid cooling cold plate concepts. To address these future cooling needs, micro-scaled cooling structures are being developed. Two examples of such structures are marketed by Mikros Manufacturing, Inc., of Claremont, N.H., and ATOTECH of Berlin, Germany. Other examples of micro-scaled cooling structures are also available in the art. These micro-scaled cooling structures have a characteristic dimension more than an order of magnitude less than the cold plates previously employed. Further, the micro-scaled structures have a minimum dimension on the order of or smaller than particulates that regularly circulate through the system coolant of a cooling system such as depicted in FIGS. 1 & 2. In available micro-scaled structures, the characteristic dimension currently ranges from 50 to 100 micrometers (microns), and could be further reduced as the technology matures. At these small width scales, liquid cleanliness is imperative. At such dimensions, the micro-scaled cooling structure could act more like a filter than a heat sink, thereby inhibiting cooling.

One solution to the problem would be to introduce a filter into the system coolant side of the cooling assembly of FIGS. 1 & 2. This, unfortunately, would be undesirable because it would add additional pressure drop and would require continuing maintenance. Thus, in one aspect, an objective of the present invention is to create an isolated subassembly associated with the electronics subsystem which is in thermal contact with the system coolant loop and which is designed and manufactured to accommodate the micro-scale aspects of a micro-scaled cooling structure such as described above.

Figure 3:
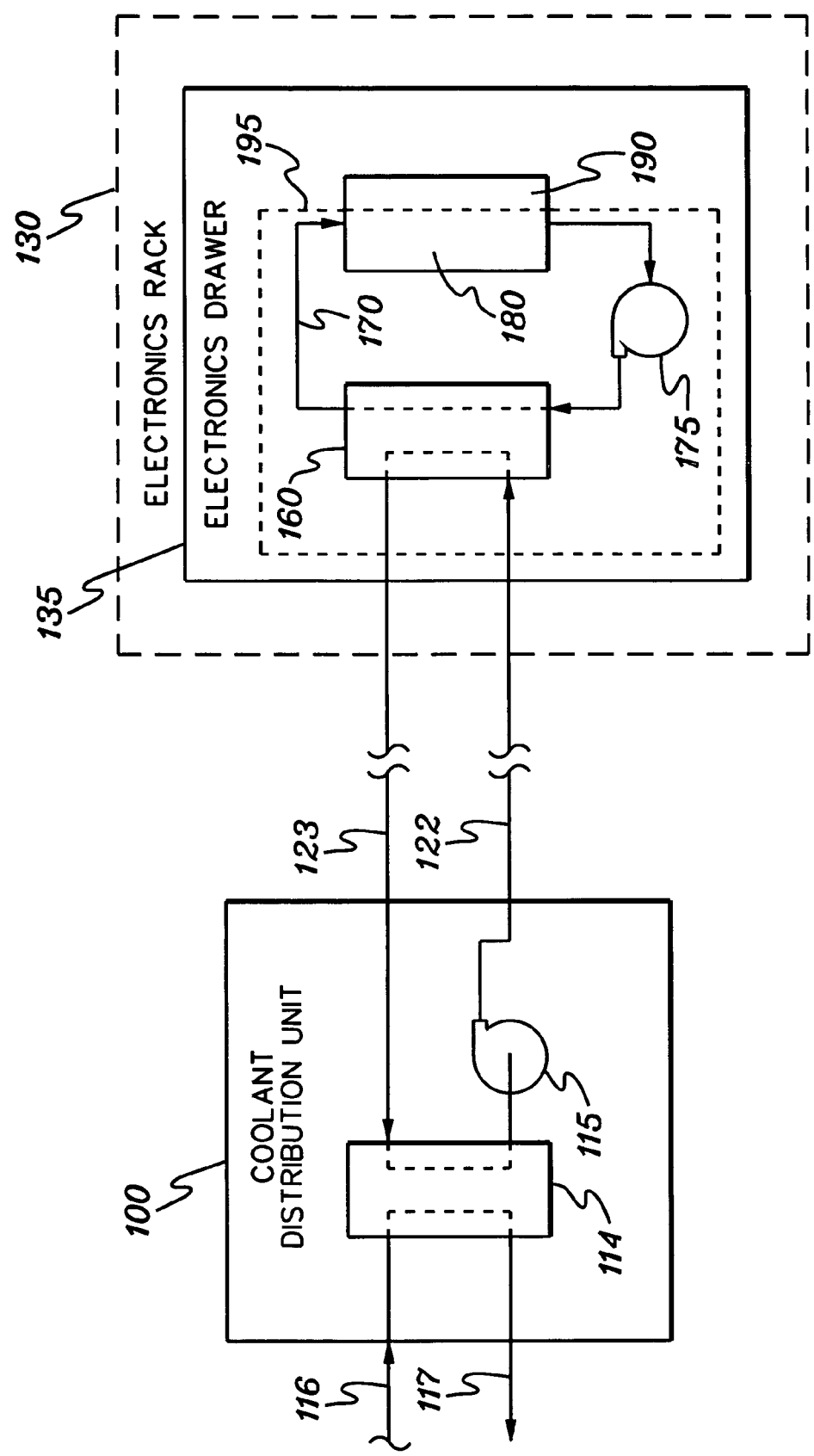
FIG. 3 is a schematic of one embodiment of a cooling system for an electronics subsystem of an electronics rack, which includes a coolant distribution unit and a thermal dissipation unit comprising a conditioned coolant loop within the electronics subsystem, in accordance with an aspect of the present invention.

FIG. 3 depicts one embodiment of a cooling system accomplishing this objective. This cooling system or apparatus includes a coolant distribution unit 100 and one or more thermal dissipation units 195. Each thermal dissipation unit 195 is associated with a respective electronics subsystem or drawer 135 of an electronics rack 130 of the computing environment. The coolant distribution unit 100 again includes a first heat exchanger 114, a first cooling loop 116, 117, and one or more second cooling loops 122, 123. The first cooling loop 116, 117 receives facility coolant and passes at least a portion thereof through the first heat exchanger 114. Each second cooling loop provides system coolant to at least one electronics subsystem 135 and expels heat in the first heat exchanger 114 from electronics subsystem 135 to the facility coolant in the first cooling loop 116, 117. System coolant is circulated within the second cooling loop 122, 123 via a pump 115.

Each thermal dissipation unit 195 is associated with a respective electronics subsystem 135, and includes a second heat exchanger 160, a second cooling loop 122, 123 of the one or more second cooling loops, a third cooling loop 170, and a micro-scaled cooling structure 180. The second cooling loop provides system coolant to the second heat exchanger 160, and the third cooling loop circulates conditioned coolant within the at least one electronics subsystem through the micro-scaled cooling structure 180 and expels heat in the second heat exchanger 160 from a heat generating component 190 (e.g., electronics module) of the electronics subsystem 135. The heat is expelled in the heat exchanger to the system coolant in the second cooling loop 122, 123. Conditioned coolant circulates via a pump 175 through the third cooling loop 170 of the thermal dissipation unit 195. One example of a suitable pump 175 is provided in the initially incorporated, commonly assigned, co-filed application entitled: "Cooling Apparatus For An Electronics Subsystem Employing A Coolant Flow Drive Apparatus Between Coolant Flow Paths". In one example, the third cooling loop is a closed loop fluid path, thereby minimizing the opportunity for particulate to enter the cooling loop once the conditioned coolant has been filtered as described below.

Advantageously, the third cooling loop is physically isolated from the system coolant of the cooling assembly. The third cooling loop is a separate, dedicated loop or subassembly localized to the electronics subsystem, and to more particularly, the one or more heat generating components, such as an electronic module thereof, that is to be cooled. The third cooling loop and associated components comprise a subassembly that is manufactured to create a pristine environment from both a particulate and materials compatibility (i.e., corrosion) viewpoint. The cooling subassembly 195 is designed to be a closed system once operational (i.e., a system that is not opened in the field). Being a closed subsystem in the field, particulate contamination can be managed during assembly.

Figure 4A:
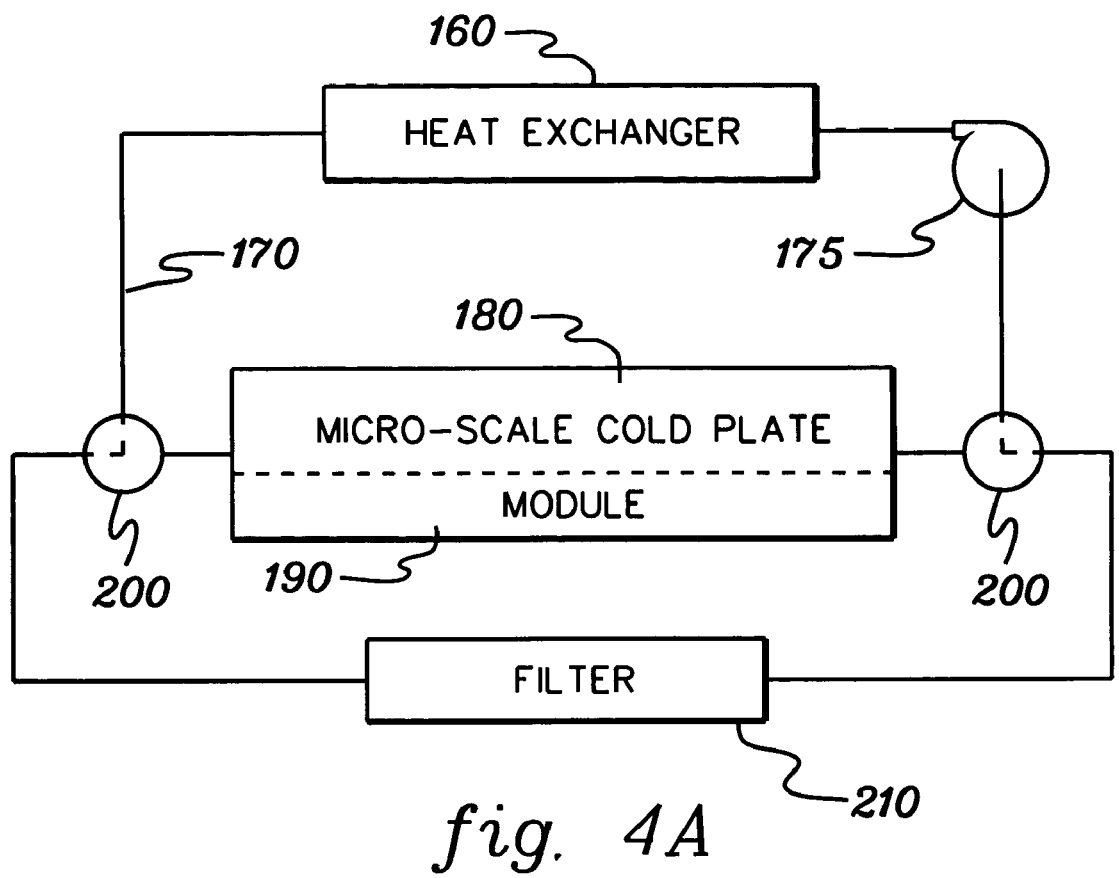
FIG. 4A depicts one embodiment of a method of filtering conditioned coolant within the conditioned coolant loop of the cooling system of FIG. 3, in accordance with an aspect of the present invention.
Figure 4B:
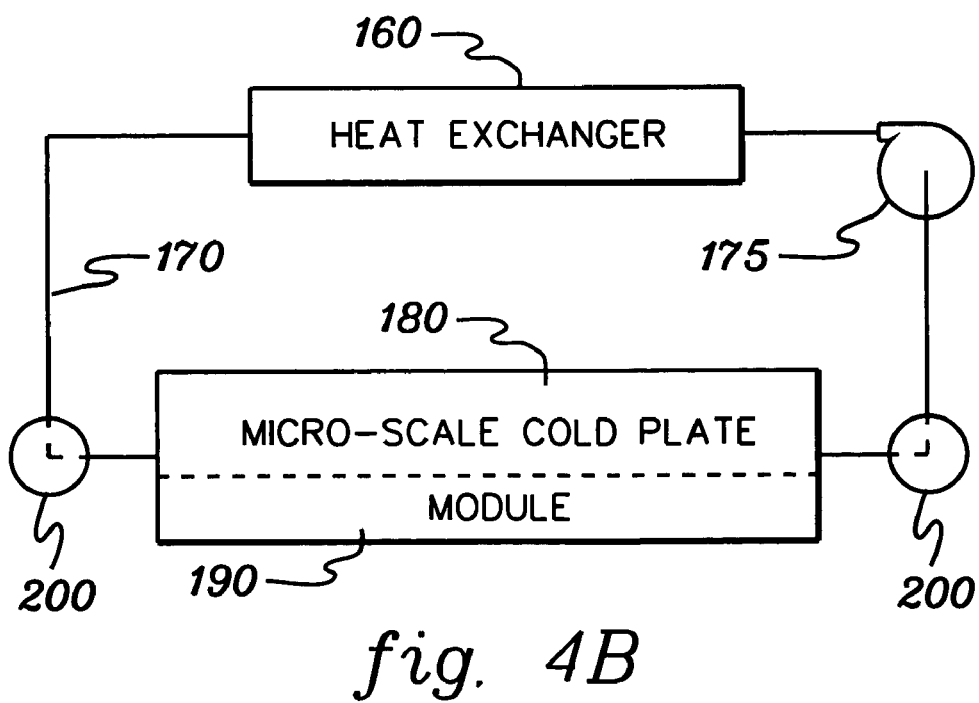
FIG. 4B depicts one embodiment of the thermal dissipation unit components of FIG. 4A, shown coupled to an electronics module to be cooled, in accordance with an aspect of the present invention.
Figure 5A:
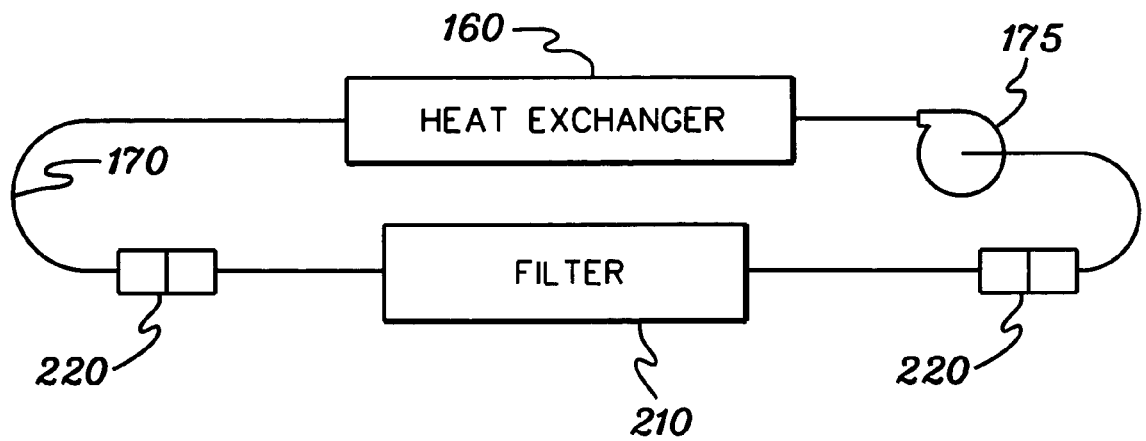
FIG. 5A depicts an alternate embodiment of a method of filtering conditioned coolant within the conditioned coolant loop of the cooling system of FIG. 3, in accordance with an aspect of the present invention.

FIGS. 4A & 5A depict alternate assemblies for filtering conditioned coolant within the thermal dissipation unit, for example, during fabrication of the unit. In FIG. 4A, the system subassembly 195 of FIG. 3 is shown associated with an electronics module 190, which may be integrated with or coupled to the micro-scaled cooling structure 180. The subassembly includes two three-way valves 200, which are opened in this example to allow coolant flow through a filter 210 rather than through the micro-scaled cooling structure 180. The conditioned coolant pumped 175 through the heat exchanger, the third cooling loop 170 and filter 210 via the three-way valves 200, is purified to a desired level for a particular application. Note that filter 210 can be any filtering mechanism designed to cleanse the conditioned coolant flowing through the third cooling loop 170 in a desired manner, and may include particulate filtering (resulting, e.g., from the manufacturing and assembly process), as well as chemical filtering (e.g., to remove undesired corrosive components from the coolant). Once filtered, valves 200 are either manually or automatically adjusted to remove filter 210 from the third cooling loop 170, thereby allowing the conditioned coolant to flow through the micro-scaled cooling structure 180 and heat exchanger 160 by means of pump 175 (see FIG. 4B).

FIG. 5A depicts an alternate method for filtering conditioned coolant within loop 170 of the cooling subassembly 195 of FIG. 3. In this embodiment, connect/disconnect couplings 220 are employed to connect a filter 210 to the third cooling loop 170. Filter 210 can again comprise any filtering mechanism for removing, for example, undesirable particulate and chemical components from the conditioned coolant flowing through the third cooling loop 170. Coolant is pumped 175 through the heat exchanger 160, the third cooling loop 170 and filter 210 for a sufficient period of time to achieve the desired level of coolant purity.

Figure 5B:
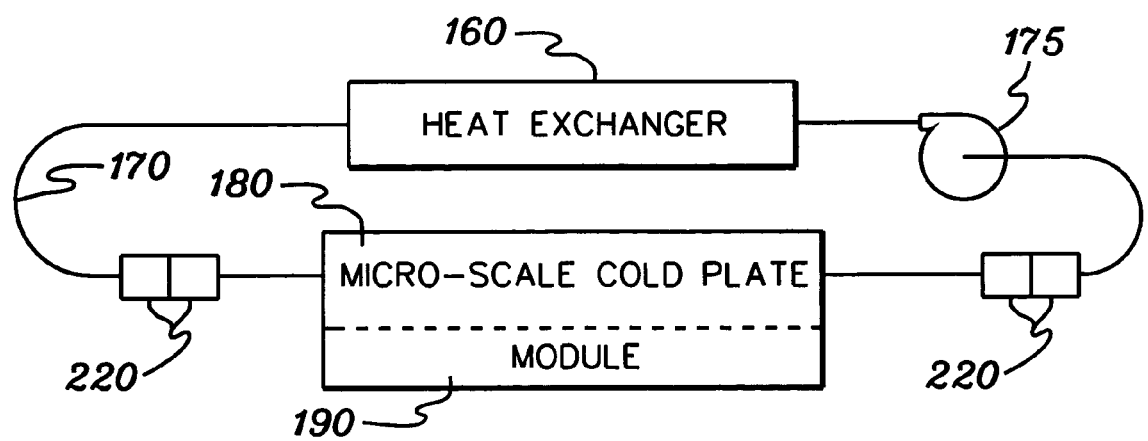
FIG. 5B depicts one embodiment of the thermal dissipation unit components after filtering of the conditioned coolant, and shown coupled to an electronics module to be cooled, in accordance with an aspect of the present invention.
Figure 6A:
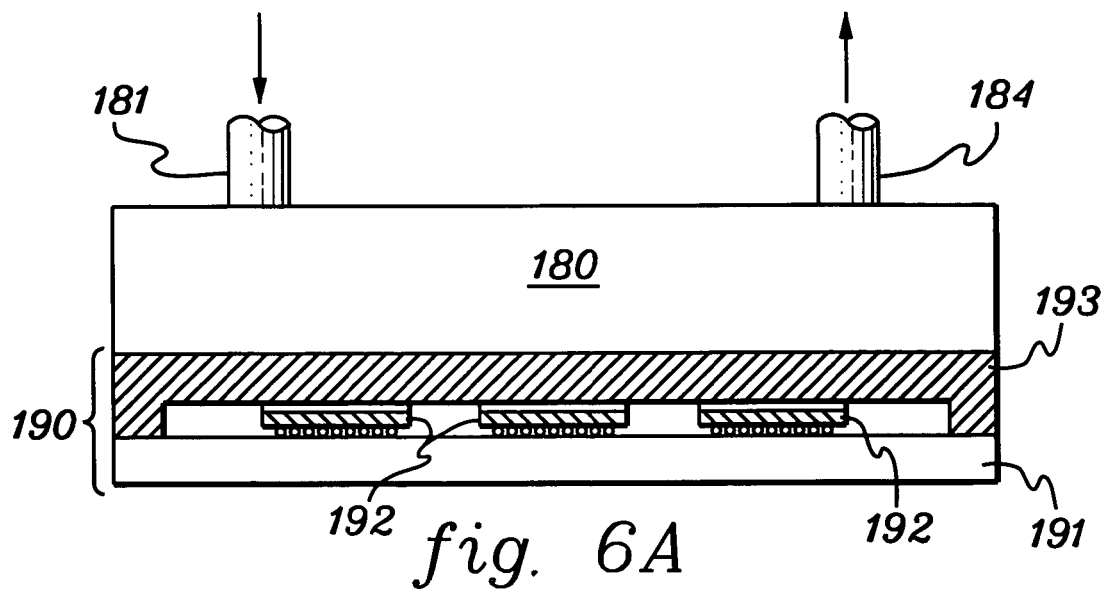
FIG. 6A is a cross-sectional elevational view of one embodiment of a micro-scaled cooling structure coupled to an electronics module for indirect expelling of heat from the integrated circuit chips of the module to conditioned coolant within the micro-scaled cooling structure, in accordance with an aspect of the present invention.
Figure 6B:
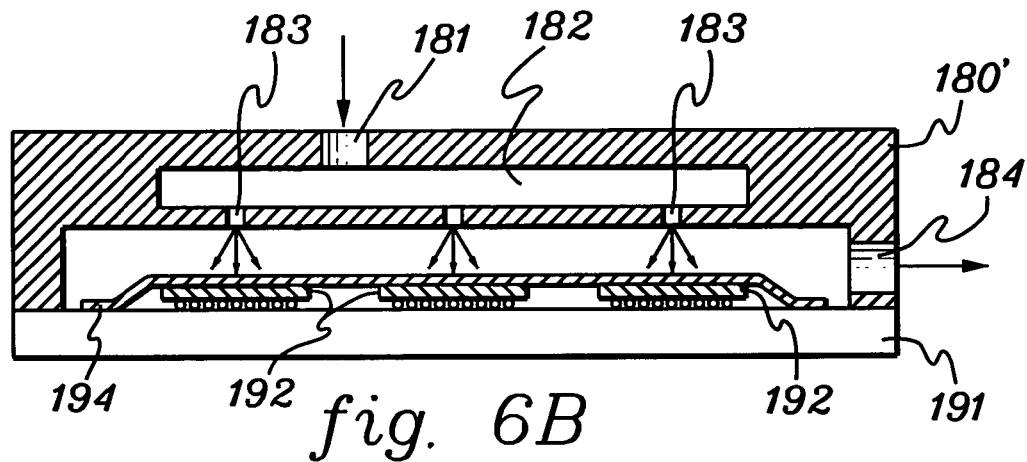
FIG. 6B is a cross-sectional elevational view of an alternate embodiment of a micro-scaled cooling structure coupled to a substrate having a plurality of integrated circuit chips thereon, with conditioned coolant being separated from the integrated circuit chips by an impermeable barrier layer, in accordance with an aspect of the present invention.
Figure 6C:
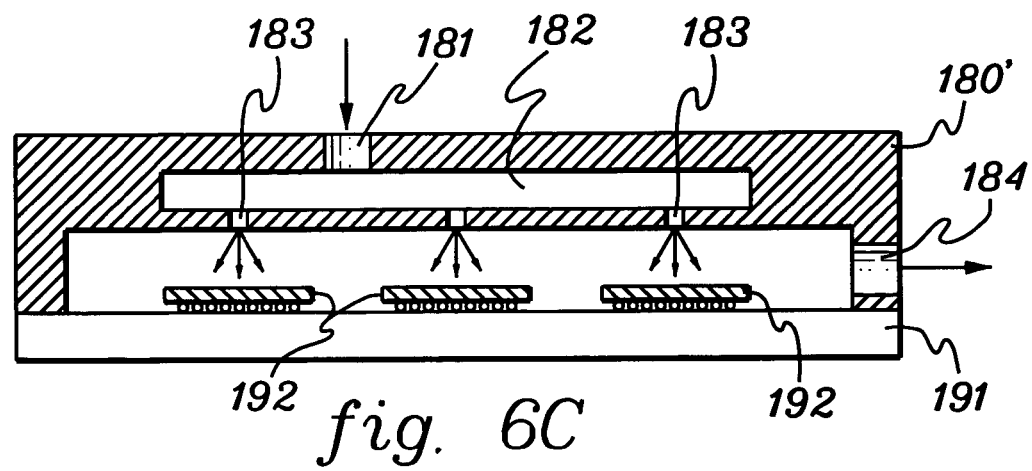
FIG. 6C is a cross-sectional elevational view of another embodiment of a micro-scaled cooling structure coupled to a substrate having a plurality of integrated circuit chips thereon, wherein the integrated circuit chips are cooled by direct conditioned coolant immersion, in accordance with an aspect of the present invention.

As shown in FIG. 5B, after the conditioned coolant has been appropriately filtered, filter 210 is removed and the micro-scaled cooling structure 180 is inserted into the third cooling loop, again using the couplings 220. In the embodiment shown, an electronic module 190 is assumed to be integrated with or coupled to the micro-scaled cooling structure 180. Various embodiments for coupling structure 180 to an electronic module are depicted in FIGS. 6A–6C and discussed further below.

Those skilled in the art will note that provided herein is a cooling assembly which employs three distinct cooling loops. A first cooling loop and a second cooling loop are associated with a coolant distribution unit which includes a fluid-to-fluid heat exchanger to allow the transfer of heat from system coolant within the second cooling loop to facility coolant within the first cooling loop. One or more thermal dissipation units or cooling subassemblies are associated with one or more electronics subsystems of, for example, an electronics rack. Each thermal dissipation unit includes a respective second cooling loop and a third cooling loop, which in one example, comprises an isolated, closed loop flow path. The thermal dissipation unit further includes a second fluid-to-fluid heat exchanger which allows heat to be expelled from conditioned coolant within the third cooling loop to the system coolant within the second cooling loop for transfer to the coolant distribution unit. Advantageously, by separating the conditioned coolant, system coolant and facility coolant, each coolant loop can have coolant of different properties or characteristics. These different characteristics can include different:

Coolant purity—which allows the use of higher purity coolant within the third cooling loop, less pure coolant within the system coolant loop, and still less pure coolant within the facility coolant loop. High purity coolant is desirable in the third cooling loop of the thermal dissipation unit, particularly when used with small-scale cooling structures (i.e., channels, nozzles, orifices, fins, etc.) to prevent contaminants from interfering with operation of, for example, a micro-scaled cooling structure.

Coolant pressure—which allows, for example, conditioned coolant within the third cooling loop to be at a pressure below atmospheric pressure, while system coolant and facility coolant in the second cooling loop and the first cooling loop remain at or above atmospheric pressure. This allows, for example, the conditioned coolant to have a different boiling point than the system coolant.

Coolant phase change—the third cooling loop allows a conditioned coolant to be employed in a two-phase cooling approach, while maintaining the system coolant and facility coolant as single-phase coolants.

Coolant flow rate—which may be related to different pressures and phase change temperatures of the various coolants in the cooling system. Further, it may be desirable to employ a lower flow rate through the micro-scaled cooling structure than the flow rate through, for example, the second cooling loop containing the system coolant.

Coolant chemistry—which allows different coolant fluid chemistries to be employed in the various cooling loops of the cooling system. For example, water could be employed in the first and second cooling loops as both the facility coolant and the system coolant, only of different purity, while the third cooling loop may employ a dielectric as the conditioned coolant. This may be advantageous, for example, in an embodiment where the conditioned coolant directly contacts one or more integrated circuit chips of the electronics subsystem being cooled.

As noted, FIGS. 6A–6C depict various embodiments for coupling a micro-scaled cooling structure 180 to one or more heat generating components of an electronics subsystem. In FIG. 6A, an electronic module 190 includes a substrate 191 having multiple integrated circuit chips 192 disposed thereon. A module lid 193 encases the integrated circuit chips within the module 190. Module 190 is shown mechanically coupled to a micro-scaled cooling structure 180 through which conditioned coolant (not shown) flows via an inlet 181 and outlet 184. Module lid 193 and micro-scaled cooling structure 180 are fabricated of materials appropriate for facilitating thermal transfer from integrated circuit chips 192 to the conditioned coolant flowing through the micro-scaled structure. As one enhancement, the micro-scaled cooling structure 180 may be part of a thermal dissipation unit which is a field replaceable unit. In such a case, connect/disconnect couplings may be employed in the second cooling loop to couple the system coolant to the newly replaced thermal dissipation unit without requiring opening of the third cooling loop containing the conditioned coolant flowing through the micro-scaled cooling structure 180.

FIG. 6B depicts an alternate embodiment of a micro-scaled cooling structure coupled to a chip assembly, which is referred to herein as near-direct coolant immersion. In this embodiment, cooling structure 180' couples to a substrate 191 having multiple integrated circuit chips 192 thereon. A multi-layer impermeable barrier 194 resides over the integrated circuit chips and protects the chips from the conditioned coolant flowing through the micro-scaled cooling structure 180'. Conditioned coolant flows onto the impermeable barrier 194 via micro-scaled orifices 183 in fluid communication with a supply manifold 182 receiving conditioned coolant via an inlet 181. Conditioned coolant flows from the integrated assembly via an outlet 184 in the micro-scaled cooling structure 180'. With this embodiment, any type of coolant may be employed, with water being one example. Advantageously, liquid is in near-direct contact with the integrated circuit chips, but remains isolated therefrom. Examples of near-direct integrated cooling structure and module assemblies are described in greater detail in commonly assigned U.S. Pat. No. 6,587,345 entitled "Electronic Device Substrate Assembly With Impermeable Barrier And Method Of Making" and U.S. Patent Application No. 2004/0012914 A1, entitled "Electronic Device Substrate Assembly With Multilayer Impermeable Barrier And Method Of Making", both of which are hereby incorporated herein by reference in their entirety.

FIG. 6C depicts still another attachment embodiment for integrating a micro-scaled cooling structure with an integrated circuit assembly. This embodiment is referred to as direct coolant immersion since the conditioned coolant impinges directly onto the multiple integrated circuit chips 192 disposed on substrate 191. As shown, the micro-scaled cooling structure 180' again includes micro-scale orifices 183 which provide conditioned coolant from a supply manifold 182 in fluid communication with an inlet 181 coupled to the third cooling loop of the respective thermal dissipation unit. The micro-scaled cooling structure 180' in FIG. 6C includes an outlet 184, which is in fluid communication with the third cooling loop 170 of the thermal dissipation unit 195 of, for example, FIG. 3. With direct coolant immersion, the substrate and the cooling assembly are an integrated unit, and no fluid barrier exists between the conditioned coolant and the integrated circuit chips. This is possible by using a dielectric coolant selected so as not to damage the integrated circuit chips. A more detailed discussion of an integrated micro-scaled cooling structure and circuit subassembly is provided in the initially incorporated, commonly assigned, co-filed application entitled: "Cooling Apparatus And Method For An Electronics Module Employing An Integrated Heat Exchange Assembly".

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A cooling system comprising:
   a coolant distribution unit, the coolant distribution unit comprising a first heat exchanger, a first cooling loop and at least one second cooling loop, the first cooling loop receiving facility coolant and passing at least a portion thereof through the first heat exchanger, the at least one second cooling loop providing system coolant to at least one electronics subsystem, and expelling heat in the first heat exchanger from the at least one electronics subsystem to the facility coolant in the first cooling loop; and
   at least one thermal dissipation unit associated with the at least one electronics subsystem, each thermal dissipation unit comprising a second heat exchanger, a second cooling loop of the at least one second cooling loop, and a third cooling loop, the second cooling loop providing system coolant to the second heat exchanger, the third cooling loop circulating conditioned coolant within the at least one electronics subsystem and expelling heat in the second heat exchanger from the at least one electronics subsystem to the system coolant in the second cooling loop.

2. The cooling system of claim 1, wherein the conditioned coolant in the third cooling loop and the system coolant in the second cooling loop differ by at least one characteristic, the at least one characteristic comprising at least one of: coolant purity; coolant pressure; coolant flow rate; coolant phase change temperature; and coolant chemistry.

3. The cooling system of claim 2, wherein the conditioned coolant in the third cooling loop and the system coolant in the second cooling loop differ by multiple characteristics, the multiple characteristics comprising at least some of: coolant purity; coolant pressure; coolant flow rate; coolant phase change temperature; and coolant chemistry.

4. The cooling system of claim 2, wherein the system coolant in the second cooling loop and the facility coolant in the first cooling loop differ by at least one characteristic, the at least one characteristic comprising at least one of: coolant purity; coolant pressure; coolant flow rate; coolant phase change temperature; and coolant chemistry.

5. The cooling system of claim 1, wherein the third cooling loop of each thermal dissipation unit comprises an isolated, closed loop fluid path disposed within the at least one electronics subsystem.

6. The cooling system of claim 5, wherein each thermal dissipation unit further includes at least one micro-scaled cooling structure and a coolant pump for moving conditioned coolant through the closed loop fluid path of the third cooling loop between the second heat exchanger and the micro-scaled cooling structure.

7. The cooling system of claim 6, wherein the micro-scaled cooling structure is coupled to at least one heat generating component of the at least one electronics subsystem for facilitating expelling heat therefrom to the conditioned coolant within the closed loop fluid path of the third cooling loop.

8. The cooling system of claim 7, wherein each thermal dissipation unit comprises a field replaceable unit, and wherein the micro-scaled cooling structure mechanically couples to a surface of the heat generating component, the heat generating component comprising an electronic module.

9. The cooling system of claim 7, wherein the at least one heat generating component comprises at least one integrated circuit chip, and wherein the conditioned coolant within the third cooling loop directly contacts the at least one integrated circuit chip of the at least one electronics subsystem.

10. The cooling system of claim 9, wherein the conditioned coolant comprises a dielectric fluid.

11. The cooling system of claim 7, wherein the at least one heat generating component comprises at least one integrated circuit chip, and wherein each thermal dissipation unit further includes a thermally conductive fluid barrier separating the conditioned coolant in the third cooling loop from the at least one integrated circuit chip.

12. The cooling system of claim 11, wherein the conditioned coolant comprises purified water.

13. A cooled electronics system comprising:
   at least one electronics rack comprising a plurality of electronics subsystems; and
   a cooling system comprising:
      a coolant distribution unit, the coolant distribution unit comprising a first heat exchanger, a first cooling loop and a plurality of second cooling loops, the first cooling loop receiving facility coolant and passing at least a portion thereof through the first heat exchanger, the plurality of second cooling loops providing system coolant to at least some of the plurality of electronics subsystems, and expelling heat in the first heat exchanger from the at least some electronics subsystems to the facility coolant in the first cooling loop; and
      multiple thermal dissipation units each associated with a respective one of the at least some electronics subsystems, each thermal dissipation unit comprising a second heat exchanger, a second cooling loop of the plurality of second cooling loops, and a third cooling loop, the second cooling loop providing system coolant to the second heat exchanger, the third cooling loop circulating conditioned coolant within the respective electronics subsystem and expelling heat in the second heat exchanger from the electronics subsystem to the system coolant in the second cooling loop.

14. The cooled electronics system of claim 13, wherein the conditioned coolant in the third cooling loop and the system coolant in the second cooling loop of each thermal dissipation unit differ by at least one characteristic, the at least one characteristic comprising at least one of: coolant purity; coolant pressure; coolant flow rate; coolant phase change temperature; and coolant chemistry.

15. The cooled electronics system of claim 14, wherein the conditioned coolant in the third cooling loop and the system coolant in the second cooling loop of each thermal dissipation unit differ by multiple characteristics, the multiple characteristics comprising at least some of: coolant purity; coolant pressure; coolant flow rate; coolant phase change temperature; and coolant chemistry.

16. The cooled electronics system of claim 14, wherein the system coolant in the plurality of second cooling loops and the facility coolant in the first cooling loop differ by at least one characteristic, the at least one characteristic comprising at least one of: coolant purity; coolant pressure; coolant flow rate; coolant phase change temperature; and coolant chemistry.

17. The cooled electronics system of claim 13, wherein the third cooling loop of each thermal dissipation unit comprises an isolated, closed loop fluid path disposed within the respective electronics subsystem.

18. The cooled electronics system of claim 17, wherein each thermal dissipation unit further includes at least one micro-scaled cooling structure and a coolant pump for moving conditioned coolant through the closed loop fluid path of the third cooling loop between the second heat exchanger and the micro-scaled cooling structure, wherein the micro-scaled cooling structure is coupled to at least one heat generating component of the respective electronics subsystem for facilitating expelling heat therefrom to the conditioned coolant within the closed loop fluid path of the third cooling loop.

19. The cooled electronics system of claim 18, wherein the at least one micro-scaled cooling structure mechanically couples to a surface of the heat generating component, and wherein the heat generating component comprises an electronic module.

20. The cooled electronics system of claim 18, wherein the at least one heat generating component comprises at least one integrated circuit chip, and wherein the conditioned coolant within the third cooling loop directly contacts the at least one integrated circuit chip of the at least one electronics subsystem.

21. The cooled electronics system of claim 18, wherein the at least one heat generating component comprises at least one integrated circuit chip, and wherein each thermal dissipation unit further includes a thermally conductive fluid barrier separating the conditioned coolant in the third cooling loop from the at least one integrated circuit chip.

22. A method of cooling at least one electronics subsystem, the method comprising:
providing a coolant distribution unit, the coolant distribution unit comprising a first heat exchanger, a first cooling loop and at least one second cooling loop, the first cooling loop receiving facility coolant and passing at least a portion thereof through the first heat exchanger, the at least one second cooling loop providing system coolant to at least one electronics subsystem, and expelling heat in the first heat exchanger from the at least one electronics subsystem to the facility coolant in the first cooling loop; and providing at least one thermal dissipation unit associated with the at least one electronics subsystem, each thermal dissipation unit comprising a second heat exchanger, a second cooling loop of the at least one second cooling loop, and a third cooling loop, the second cooling loop providing system coolant to the second heat exchanger, the third cooling loop circulating conditioned coolant within the at least one electronics subsystem and expelling heat in the second heat exchanger from the at least one electronics subsystem to the system coolant in the second cooling loop.

23. The method of claim 22, wherein the conditioned coolant in the third cooling loop and the system coolant in the second cooling loop differ by at least one characteristic, the at least one characteristic comprising at least one of: coolant purity; coolant pressure; coolant flow rate; coolant phase change temperature; and coolant chemistry.

24. The method of claim 23, wherein the system coolant in the second cooling loop and the facility coolant in the first cooling loop differ by at least one characteristic, the at least one characteristic comprising at least one of: coolant purity; coolant pressure; coolant flow rate; coolant phase change temperature; and coolant chemistry.

25. The method of claim 22, wherein the providing at least one thermal dissipation unit includes providing each thermal dissipation unit with a micro-scaled cooling structure and a coolant pump for moving conditioned coolant through the third cooling loop, wherein the third cooling loop comprises an isolated, closed loop fluid path between the second heat exchanger and the micro-scaled cooling structure, and wherein the method further comprises coupling the micro-scaled cooling structure to at least one heat generating component of the at least one electronics subsystem for facilitating expelling heat therefrom to the conditioned coolant within the closed loop fluid path of the third cooling loop.

26. The method of claim 25, wherein the providing at least one thermal dissipation unit further comprises filtering the conditioned coolant within the third cooling loop, and wherein the filtering comprises temporarily coupling a filter in fluid communication with the third cooling loop employing at least one of multiple three-way valves in fluid communication with the third cooling loop or multiple compression couplings integrated within the third cooling loop.

\* \* \* \* \*